(12) United States Patent
Boutami et al.

(10) Patent No.: US 10,698,160 B2
(45) Date of Patent: Jun. 30, 2020

(54) DEVICE FOR COUPLING A FIRST WAVEGUIDE WITH A SECOND WAVEGUIDE

(71) Applicant: COMMISSARIAT A L'ENERGIE ATOMIQUE ET AUX ENERGIES ALTERNATIVES, Paris (FR)

(72) Inventors: Salim Boutami, Grenoble (FR); Karim Hassan, Moneteau (FR); Bayram Karakus, Saint Martin d'Heres (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/334,471

(22) PCT Filed: Sep. 22, 2017

(86) PCT No.: PCT/EP2017/074138
§ 371 (c)(1),
(2) Date: Mar. 19, 2019

(87) PCT Pub. No.: WO2018/055139
PCT Pub. Date: Mar. 29, 2018

(65) Prior Publication Data
US 2019/0384004 A1   Dec. 19, 2019

(30) Foreign Application Priority Data
Sep. 23, 2016 (FR) ...................................... 16 58993

(51) Int. Cl.
*G02B 6/26* (2006.01)
*G02B 6/122* (2006.01)
(Continued)

(52) U.S. Cl.
CPC .............. *G02B 6/26* (2013.01); *G02B 6/1228* (2013.01); *H01L 31/02327* (2013.01); *H01L 31/1075* (2013.01)

(58) Field of Classification Search
None
See application file for complete search history.

(56) References Cited

U.S. PATENT DOCUMENTS 5,586,209 A * 12/1996 Matsuura ........... G02B 6/12007
                                                        385/132
5,764,681 A *  6/1998 Ballantyne .............. H01S 3/063
                                                         372/92

(Continued)

FOREIGN PATENT DOCUMENTS

WO   WO 2009/002253 A1   12/2008
WO   WO 2015/120583 A1    8/2015

OTHER PUBLICATIONS

English translation of written opinion for PCT/EP/2017/074138, dated Dec. 1, 2017. (Year: 2017).*

(Continued)

*Primary Examiner* — Michael Stahl
(74) *Attorney, Agent, or Firm* — Oblon, McClelland, Maier & Neustadt, L.L.P.

(57) ABSTRACT

A device for coupling a first waveguide with a second waveguide, wherein the core of the second guide includes an end portion having at least a flat end wall rotated facing, and preferably, in contact with the core of the first guide, a flared part of convex shape extending the end wall by extending from the first guide, the flared part having a section which increases by extending from the first guide, a narrowing, a main portion, extending the end portion by extending from the first guide and having a substantially constant section.

21 Claims, 10 Drawing Sheets

(51) Int. Cl.
*H01L 31/0232* (2014.01)
*H01L 31/107* (2006.01)

(56) References Cited

U.S. PATENT DOCUMENTS

| | | |
|---|---|---|
| 9,391,225 B1 | 7/2016 | Davids et al. |
| 2004/0037497 A1 | 2/2004 | Lee |
| 2005/0123232 A1* | 6/2005 | Piede ................ G02B 6/1228 385/14 |
| 2010/0322560 A1 | 12/2010 | Granestrand et al. |
| 2011/0116741 A1* | 5/2011 | Cevini ................ G02B 6/305 385/28 |
| 2014/0023314 A1 | 1/2014 | Onishi |
| 2014/0286616 A1 | 9/2014 | Heideman et al. |
| 2016/0246003 A1 | 8/2016 | Heideman et al. |
| 2016/0351743 A1 | 12/2016 | Yu et al. |
| 2018/0102448 A1* | 4/2018 | Boutami ............ H01L 31/028 |

OTHER PUBLICATIONS

International Search Report dated Dec. 1, 2017 in PCT/EP2017/074138 filed on Sep. 22, 2017.
Acoleyen, K. V. et al., "Compact lens-assisted focusing tapers fabricated on Silicon-On-Insulator," Photonics Research Group, Department of Information Technology (INTEC), Ghent University—imec, Belgium, 978-1-4244-8339-6/11/$26.00 © 2011 IEEE, pp. 157-159.

* cited by examiner

|  |  | $W_0=0.6\mu m$ | $W_0=0.5\mu m$ | $W_0=0.4\mu m$ | $W_0=0.3\mu m$ | $W_0=0.2\mu m$ |
|---|---|---|---|---|---|---|
| Absorptivity | Conventional photodiode | 91,30% | 86,40% | 78,10% | 69,70% | 54,15% |
|  | Photodiodes according to the invention | 95,20% | 91,60% | 88,20% | 78,40% | 56,20% |
| Bandwidth | Conventional photodiode | 76 GHz | 91 GHz | 101 GHz | 104 GHz | 94 GHz |
|  | Photodiodes according to the invention | 56 GHz | 89,5 GHz | 98,5 GHz | 101,2 GHz | 92,2 GHz |
| Product absorptivity × bandwidth | Conventional photodiode | 69,4 GHz | 78,6 GHz | 78,9 GHz | 72,5 GHz | 50,9 GHz |
|  | Photodiodes according to the invention | 53,3 GHz | 82,0 GHz | 86,9 GHz | 79,3 GHz | 51,8 GHz |

FIG. 8b

DEVICE FOR COUPLING A FIRST WAVEGUIDE WITH A SECOND WAVEGUIDE

TECHNICAL FIELD OF THE INVENTION

The invention generally relates to the coupling of waveguides applied to micro and nanotechnologies.

The invention has an advantageous, but non-limiting application in the field of photodiodes with the coupling between a first guide, by which photons penetrate and a second guide comprising an absorption portion to generate electrical charges from the absorbed photons.

STATE OF THE ART

In the field of micro and nanotechnologies, it is often necessary to couple two waveguides.

The coupling between two waveguides, each comprising a core and a sheath, must favour a maximum transmission in the core of the waveguide passed through second.

Several solutions have been developed to ensure the coupling between two waveguides in the field of micro and nanotechnologies, i.e. for waveguides of which the length is typically less than a few hundred, even a few tens of micrometres (µm, $10^{-6}$ metres).

A first solution consists of that the core of the first guide, typically made of silicon, being progressively narrowed over one hundred micrometres until reaching the proximity of the second guide, of which the entry surface is greater than that of the narrowed end of the first guide.

A significant disadvantage of this solution is the volume imposed by the length of the narrowed part, usually called a "taper".

Another solution consists of placing a converging lens exiting the first guide, in order to make the wave converge in the second guide.

Such a solution is, for example, described in the publication by K. V. Acoleyen et al., which appeared in 2011 in the IEE journal, under the reference 10.1109/GROUP4.2011.6053748. In this solution, the second guide has an end being linearly narrowed, by extending from the interface, thus forming a taper. The aim of this publication is to produce a mode adapter, which is of a dimension shorter than conventional tapers.

With this solution, the end being linearly narrowed and forming a taper has a length of between 10 and 20 µm.

This dimension is also relatively large and leads to voluminous couplings between the two guides.

Another solution is used to produce double heterojunction photodiodes. This type of photodiode is illustrated in FIGS. 1 to 4.

In a double heterojunction photodiode, a first waveguide 100 is formed of a core 110 made of silicon (Si) inside which the wave is intended to be propagated and a silica ($SiO_2$) sheath 120 coating the core 110. The second waveguide 200 is formed of a core 210 made of intrinsic germanium (Ge-i) and of a sheath 220 having two doped silicon zones 221, 222 respectively n and p and situated on either side of the core 210. It is in the core 210 of the second guide that the absorption of the photons is done and the generation of electrical charges is produced.

To improve the absorptivity and therefore the performances of the photodiode, it is necessary to have the best possible coupling between the first 100 and the second 200 guides. As for the solutions mentioned above, this coupling must preferably make it possible for a mode adaptation, over the shortest distance as possible, between the first 100 and the second 200 guides.

At the interfaces between the Ge-i core 210 and the doped Si zones 221, 222 of the second guide 200, the differences in refraction indices are greater than in conventional photodiodes, wherein both the core and the doped zones are germanium-based. This increased contrast of refraction indices contributes to confining 310 in the core 210 of the second guide 200, the light waves 300 coming from the core 110 of the first guide 100.

This solution thus improves the absorption of the light within the core 210, i.e. that it improves the responsiveness of the photodiodes with respect to standard photodiodes with germanium sheaths.

However, as appears in FIG. 1, illustrating a simulation and on the schematic representation of FIG. 4, a part 320 of the light waves which penetrate into the second guide 200 are diffused in the sheath 220 within the portions 221, 222. These diffused light waves 320 are therefore not absorbed by the germanium core 210 and thus limit the performances of photodiode in terms of responsiveness.

Thus, there is a need consisting of proposing a solution to improve the performances of a coupling between two waveguides, while having a reduced volume.

Such is the aim of the present invention.

Other aims, characteristics and advantages of the present invention will appear upon examining the following description and the supporting drawings. It is understood that other advantages can be incorporated.

SUMMARY OF THE INVENTION

To achieve this aim, according to an embodiment, the present invention provides a device for coupling at least two waveguides. The device comprises a first waveguide and a second waveguide, each guide comprising a core and a sheath surrounding one part at least of the core, characterised in that the core of the second guide comprises:
  an end portion having at least:
    one end wall rotated facing, and preferably, in contact with the core of the first guide,
    one convex-shaped flared part extending the end wall, by extending from the first guide, the flared part having a section which increases by extending from the first guide, the section being taken along a transverse plane (xy) perpendicular to a main extension direction (z) of the core of the second waveguide,
    one narrowing of which the section, parallel to said transverse plane (xy), decreases by extending from the first guide,
  one main portion, extending the end portion by extending from the first guide and having a substantially constant section, taken parallel to said transverse plane (xy).

The coupling device according to the invention gives significant advantages, in particular in terms of increasing the confinement of the light waves within the core of the second waveguide, while conserving a limited volume.

In the case where the device forms a photodiode, this improved confinement leads to a reduction in the diffusivity outside of the core formed of a photo absorption material. The invention thus makes it possible to increase the responsiveness of the photodiode.

Even more unexpectedly, it has been proven, that for a given width of the absorption portion (the core of the second guide), the invention makes it possible to highly significantly increase the responsiveness of the photodiode without reducing in a manner that is too damaging, the width of the bandwidth.

In other words, the invention makes it possible to notably increase the product responsiveness times (x) bandwidth.

This represents a considerable advantage with respect to known solutions. Indeed, in a conventional coupling device, such as that of a double heterojunction photodiode, the refraction indices of the second guide ($n_{Si}$=3.45 and $n_{Ge}$=4.27) are a lot higher than the refraction indices of the first guide ($n_{SiO2}$=1.45 and $n_{Si}$=3.45). A significant part of the light thus diffuses outside of the photodiode despite the presence of the confinement.

To increase the absorptivity of the intrinsic Ge portion, a person skilled in the art, would have best considered expanding the section of the core of the second guide. This expansion would have a negative effect of decreasing the bandwidth, as the charge carriers would thus need more time to be extracted.

For an acceptable bandwidth, with solutions of the state of the art, the usual width of intrinsic germanium Ge-i is 0.6 µm ($10^{-6}$ metres). However, for this width, even for a double heterojunction photodiode, the absorptivity remains limited.

The invention itself, in particular thanks to the shape of the end portion, does not have these disadvantages or at the very least, highly limits them.

Another aim of the present invention relates to a microelectronic device comprising at least and preferably one plurality of coupling devices according to the invention.

By microelectronic device, this means any type of device produced with microelectronic means. These devices in particular comprise in addition, devices with a purely electronic purpose, micromechanical or electromechanical devices (MEMS, NEMS, etc.), as well as optical or optoelectronic devices (MOEMS, etc.).

BRIEF DESCRIPTION OF THE FIGURES

The aims, objectives, as well as the characteristics and advantages of the invention will best emerge from the detailed description of an embodiment of the latter which is illustrated by the following supporting drawings, wherein:

FIG. 6a relates to a double heterojunction photodiode as that of FIG. 4; FIG. 6b illustrates a coupling device forming in this non-limiting embodiment, for example, a double heterojunction photodiode; FIG. 6c is an expanded view of FIG. 6b centred on the interface between the first and second guides.

FIG. 8b is a table indicating the absorptivity, the bandwidth is the product absorptivity x bandwidth for the different photodiodes of FIG. 8a.

FIG. 11, comprising

Figure 1:
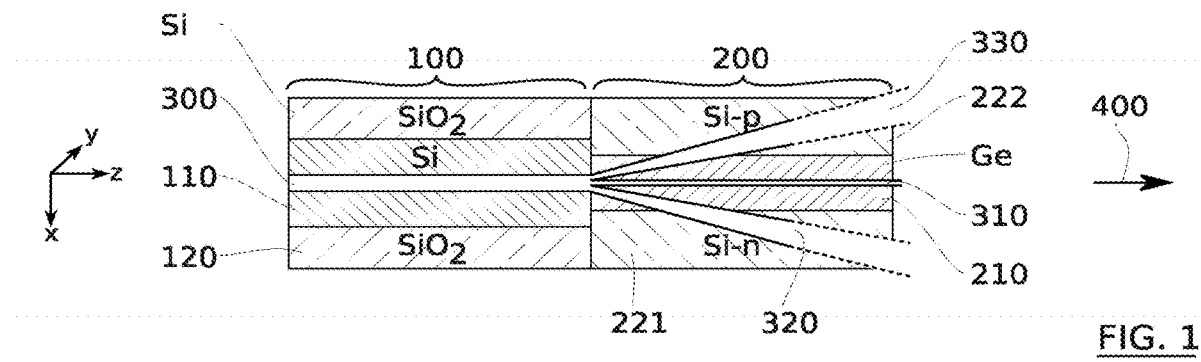
FIG. 1 is a schematic cross-sectional view of a Si-p/Ge-i/Si-n double heterojunction photodiode according to the prior art, on which a simulation of the propagation of light waves is represented schematically.
Figure 2:
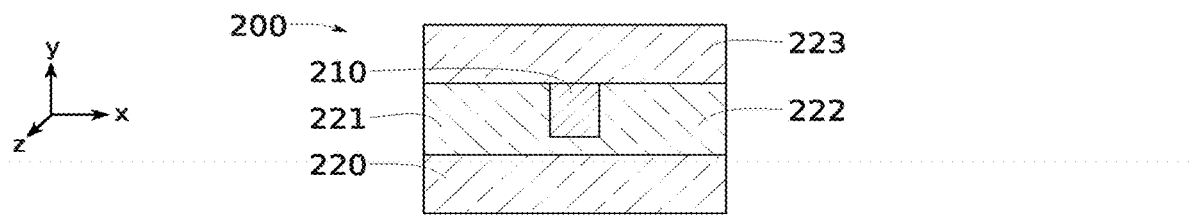
FIGS. 2 and 3 are views of a photodiode close to that of FIG. 1, along transversal cross-sections taken respectively at the level of the second guide and of the first guide.
Figure 3:
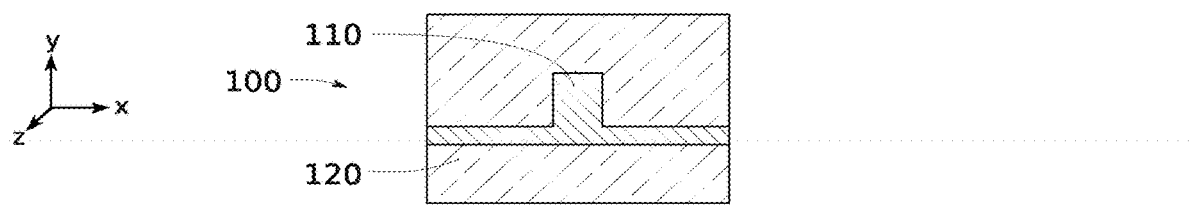
Figure 4:
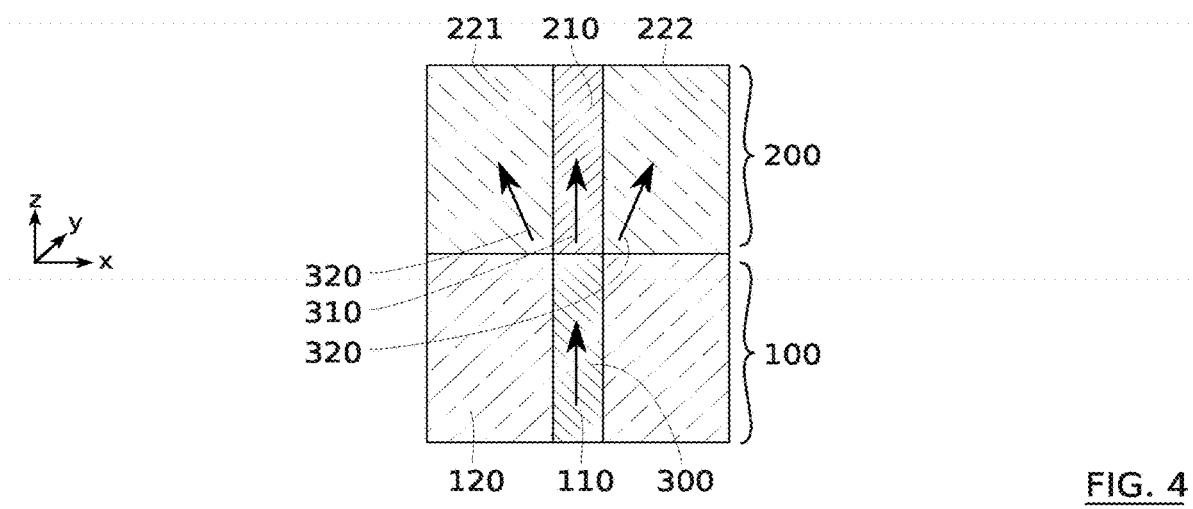
FIG. 4 is a schematic view of the photodiode of FIGS. 2 and 3 along a longitudinal cross-section, i.e. parallel to the main direction of propagation of the light waves.

The drawings are given as examples and are not limiting of the invention. They constitute schematic representations of principle intended to facilitate the understanding of the invention and are not necessarily to the scale of practical applications. In particular, the relative thicknesses of the different layers, as well as the relative dimensions of the different portions of the waveguides are not representative of reality.

DETAILED DESCRIPTION OF THE INVENTION

Before starting a detailed review of embodiments of the invention, below are stated optional characteristics, which can possibly be used in association or alternatively.

According to an embodiment, the flared part is flared according to a non-linear profile. According to an embodiment, the flared part is flared according to a sinusoidal profile, preferably according to a profile forming a quarter of a period of a sinusoidal function.

According to an embodiment, the wall delimiting the flared part forms a curve, of which all the tangents have a directing coefficient which strictly increases by extending the first guide.

According to an embodiment, the section of the main portion, taken parallel to said transversal plane, is less than that of the end portion. Preferably, the main portion has a section, parallel to said transversal plane, less than that of the narrowing wall. The main direction is parallel to the main direction of propagation of the light waves.

According to an embodiment, the narrowing extends the flared part by extending from the first guide. Preferably, the narrowing extends until it reaches the main portion.

According to an alternative embodiment, the end portion comprises a constant section part, arranged between the flared part and the narrowing.

According to an embodiment, the narrowing has a narrowing wall extending between the flared part and the main portion, said narrowing wall being substantially linear and defines with a plane perpendicular to said main direction, an angle α of between 0 and 45 degrees, preferably between 0 and 30 degrees and preferably between 0 and 15 degrees. Advantageously, the presence of an angle α having these values makes it possible for a particularly good improvement of the coupling, while facilitating a simple and reproducible production of the coupling device.

According to an embodiment, the difference between the refraction indices of the core and the sheath of the first waveguide being greater than the difference between the refraction indices of the core and of the sheath of the second waveguide. According to an embodiment, the first waveguide has a contrast of refraction indices greater than the contrast of refraction indices of the second waveguide, the index contrast of a guide being the difference between the refraction index of the core thereof and the refraction index of the sheath thereof.

According to an embodiment, the ratio of the length of the end portion over the total length of the core of the second waveguide is less than or equal to 0.7, and preferably less than or equal to 0.5, and preferably less than or equal to 0.3, these lengths being taken along said main direction. The length is taken along the main extension direction of the second guide. These values make it possible to improve the product absorptivity x bandwidth when the coupling device is a photodiode.

According to an embodiment, the cores of the first and second guides are in direct contact, i.e. that there is no element, void or area between them.

According to an embodiment, the first and second cores form a coupling interface, said interface being flat. According to an embodiment, the interface is contained in a plane parallel to said transversal plane. At all points, the section of the main portion is less than that of the end portion.

According to an embodiment, the device forms a double heterojunction photodiode. According to an embodiment, the device forms an avalanche photodiode.

According to an embodiment, at least one and preferably two from among the core of the first guide and the core of the second guide has, in a section along a plane parallel to said transversal plane, a surface less than 100 µm², preferably less than 10 µm², and preferably less than 1 µm². Typically, the diameter, if the section of the core is circular, or the largest side if the section of the core is a polygon, is less than 50 µm, preferably less than 10 µm and preferably less than 1 µm.

Also optionally, the invention can have at least any one of the following claims which can be taken in association or alternatively.

According to an embodiment, the flared part starts at the end of the end portion. Advantageously, the flared part is delimited by a curve corresponding to a quarter of the period of the sinus function, centred on 0; naturally this curve has a flat portion centred on 0.

According to an embodiment, the ratio of the maximum width WImax of the end portion over the width Wi of the end portion situated closer to the first waveguide, i.e. at the interface with the first waveguide, is of between 1.1 and 3, these widths being taken in a plane parallel to said transversal plane. This ratio makes it possible to improve the performances of the coupling, while conserving in a limited volume.

According to an embodiment, the maximum width WImax of the end portion is less than or equal to 50 µm (10⁻⁶ metres) and preferably less than or equal to 10 µm and preferably less than or equal to 1 µm. This ratio makes it possible to improve the performances of the coupling while conserving in a limited volume.

According to an embodiment, the ratio of the maximum width WImax of the end portion over a maximum width W0 of the main portion of the second waveguide is of between 1.1 and 6, these widths being taken in a plane perpendicular to said main direction. This ratio makes it possible to improve the performances of the coupling, while conserving in a limited volume.

According to an embodiment, the length Lr of the narrowing is less than the length Le of the flared part, preferably $$Lr \leq \frac{Le}{2} \text{ and } Lr \leq \frac{Le}{3} \text{ and } Lr \leq \frac{Le}{4},$$

Lr and Le being taken along the main extension direction (z) of the core of the second waveguide. This makes it possible to improve the mode adaptation between the first and the second waveguide, while conserving in a limited volume.

According to an embodiment, the core of the first guide and the core of the second guide are formed in different materials.

According to an embodiment, the core of the first guide is silicon-based, for example made of silicon, and the core of the second guide is germanium-based, for example made of germanium.

According to an embodiment, the core of one or of two guides is formed of one single layer. According to another embodiment, the core of one or of two guides is formed of a layer stack.

According to an embodiment, the core of the second waveguide is formed of an intrinsic semi-conductive material and the sheath of the second waveguide comprises at least two zones of a semi-conductive material, respectively p and n doped.

According to an embodiment, the core of the second waveguide is made of intrinsic Ge (Ge-i) and said zones are p and n doped silicon (Si) zones.

According to an embodiment, the narrowing has a narrowing wall, substantially perpendicular to said main direction.

According to an embodiment, at least one from among the sheath of the first guide and of the second guide comprises air, a gas or a void. According to an embodiment, the sheath of the first waveguide is air, a gas or a void.

It is specified that in the scope of the present invention, the terms "on", "surmounts", "covers" or "underlying" or the equivalents thereof, do not necessarily mean "in contact with". Thus, for example, the deposition of a first layer on a second layer, does not compulsorily mean that the two layers are directly in contact with either, but this means that the first layer at least partially covers the second layer by being either directly in contact with it, or by being separated by it, by at least one other layer or at least one other element.

A material A-"based" layer or core, means a layer or a core comprising this material A only, or this material A and possibly other materials, for example doping elements.

Conventionally, a doping referenced p means that it is a doping by positive charges and an n doping means that it is a doping by negative charges.

A coupling device example according to the invention, will now be described in reference to FIG. 5, then the advantages thereof will be explained in reference to FIGS. 6 to 9.

The coupling device according to the invention comprises at least one first 100 and one second 200 waveguide, preferably used such that light penetrates into the first guide 100, which thus acts as an injection guide, to then reach into the second guide 200. Each waveguide comprises a core 110, 210 and a sheath 120, 220. Advantageously, for each waveguide, the refraction index of the core is greater than the refraction index of the sheath thereof in order to confine the light beam in the cores 110, 210, by avoiding a diffusion within the sheaths 120, 220.

It will be noted, that a person skilled in the art knows how to calculate the refraction index of a sheath if the latter is heterogenous on the surface of the core.

Figure 5:
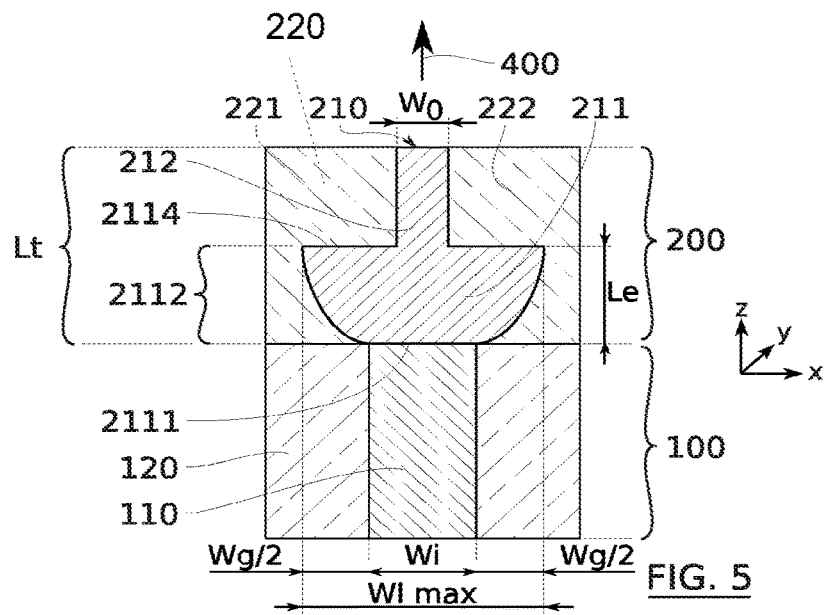
FIG. 5 is a longitudinal cross-sectional view of an example of the coupling device according to the invention, this device forming, in this non-limiting example, a photodiode.

The core 210 of the second waveguide 200 can be surrounded by a heterogenous sheath 220, as in the non-limiting example illustrated in FIG. 5. However, the flared portion 212 combined with the main portion 2112 has not or only has a small collimation effect along the direction y. The effect thereof is mainly contained along the axis x. Thus, the sheath portion to consider in terms of refraction indices is the lateral sheath, formed in this non-limiting example by the zones 221, 222. In this example, it can be an n and p doped silicon zone, of which the refraction indices are equal to that of silicon.

The invention is not limited to particular materials for the core and the sheath. Thus, silicon (Si) or intrinsic germanium (Ge-i) or silicon nitride (SiN) can be had for the core 110, 210, and silicon dioxide ($SiO_2$), silicon, even a gas such as air for example, or a void can be had for the sheaths 120, 220.

In the example illustrated, and without this being limiting, the core 110 of the first guide 100 is made of Si, the sheath 120 thereof is made of $SiO_2$, the core 210 of the second guide 200 is made of Ge-i and the sheath 220 thereof is formed of an n doped Si (Si-n) zone 221 and a p doped Si (Si-p) zone 222.

In this example, the device formed by the meeting of the two guides 100, 200 thus constitutes an Si-n/Ge-i/Si-p double heterojunction photodiode.

As illustrated in FIG. 5, the core 110 of the first waveguide 100 has a section, taken along a section xy which remains substantially constant along the axis z.

The standardised marker x, y, z is indicated in FIG. 5. The axis z corresponds to a main extension direction 400 of the core 110, 210 of the guides 100, 200. It is parallel to this main direction 400 that the major part of the luminous flux is propagated in the guides 100, 200.

The core 210 of the second waveguide 200 has a section, taken in the plane xy, which varies along the axis z. Thus, the core 210 comprises at least one end portion 211 having a flared part 2112 and a main portion 212, the latter having a section lower than the section of the end portion 211. The end portion 211 extends preferably from the end 2111 of the core 210 of the second waveguide 200. According to an embodiment, the core 210 of the second waveguide 200 is in contact with the core 110 of the first waveguide 100.

Thus, according to this non-limiting embodiment, there is no intermediate element between the cores 110, 210 of the two guides 100, 200. The coupling interface is thus formed by the end portion 211 of the core 210 of the second guide 200 and by the end portion of the core 110 of the first guide 100. Preferably, the interface between the cores 110, 210 of the two guides 100, 200 is flat. This makes it possible to facilitate the production of the coupling between the two cores 110, 210 and to favour a good transmission of light waves from one guide to the other.

Advantageously, the flared part 2112 of the core 210 is convex. It therefore forms an underside which extends into the sheath in a plane xy.

Thus, preferably, the flared part 2112 is not concave. Preferably, it does not have a linear profile in the plane xy. In other words, the wall delimiting the flared part 2112 forms a curve, of which all the tangents have a directing coefficient which strictly increases by passing through the axis z. According to a non-limiting embodiment, the wall of the flared part 2112 follows a sinus type function (by ignoring the contact wall 2111 which is flat).

The flared part 2112 is extended by a narrowing. Preferably, the narrowing is defined by a wall 2114 which extends, along the axis z, from the flared part 2112 and until the main portion 212.

In the non-limiting example illustrated in FIG. 5, the narrowing wall 2114 is linear and forms with the axis z, a right angle.

According to another embodiment, the wall 2114 can form with a plane perpendicular to the axis z, a non-zero angle $\alpha$. This embodiment will be described in detail below, in reference to FIG. 10a.

This structure of the core 210 of the second guide 200 makes it possible to considerably improve the coupling of this guide 200 with the first guide 100. This could be explained by a modal approach of the functioning of the coupling device. The flared shape of the core 210 of the second guide 200 makes it possible for an adaptation of the mode between the mode of the first guide 100 and the mode of the second guide 200. This mode adaptation is done over a very short distance thanks to the end portion 212 and the flared part 2112 thereof.

On the contrary, conventional tapers known from the state of the art are generally very long, in particular those for increasing the size of a mode.

A taper of this type is described in document [4] G. Roelkens, P. Dumon, W. Bogaerts, D. Van Thourhout, and R. Baets, "Efficient Silicon-on-Insulator Fiber Coupler Fabricated Using 248-nm-Deep UV Lithography", IEEE Photonics technology letters 17, 2613 (2005). If it was needed to place a taper having a silicon tip upstream (along the propagation direction of the light beams) of the first guide 100, this tip would require several tens of microns. The volume of the device would increase it in a very damaging manner.

Likewise, guided optical planar lenses can adapt mode sizes. They have the disadvantage of also being very long, typically around several tens, even hundreds of microns. This type of lens is, for example described in the publication mentioned in the introduction by K. V. Acoleyen et al., which appeared in 2011 in the IEE journal under the reference 10.1109/GROUP4.2011.6053748.

In the present invention, the end portion of the core 210 of the second guide 200 is, on the contrary, ultra-compact. Moreover, this is not a lens. In particular, the base thereof is preferably flat. The inner walls thereof rather play the role of mirrors to collimate the beams in the direction of the main part 212 of the second guide 200.

Figure 6A:
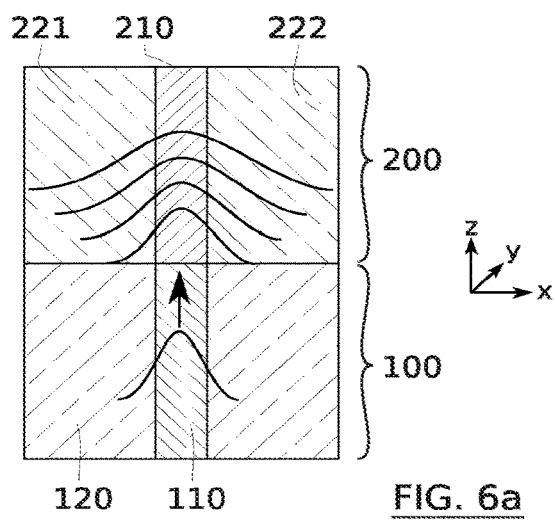
FIGS. 6a to 6c are longitudinal cross-sectional views schematically illustrating and according to a modal approach, the coupling between the first and the second guide.
Figure 6B:
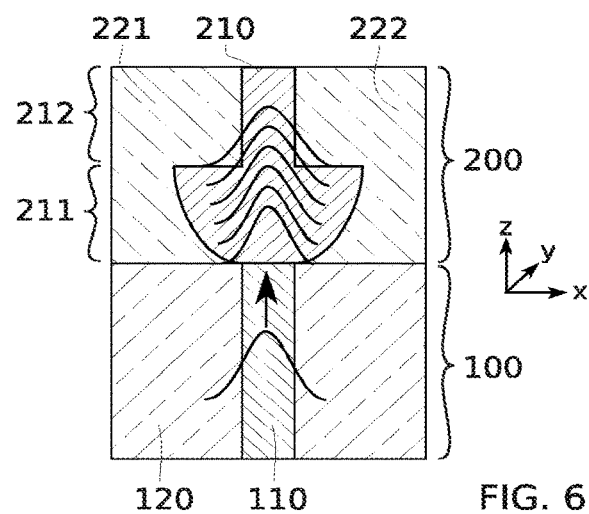
Figure 6C:
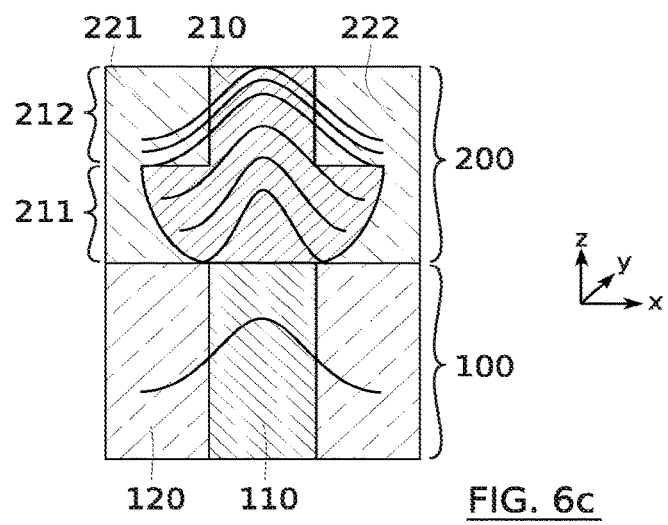

FIG. 6a illustrates a conventional Si-n/Ge/Si-p double heterojunction photodiode. The modes of the first 100 and second 200 guides are clearly different and the structure at the interface of the two guides does not make it possible for these modes to be adapted. Therefore, a mode divergence occurs. FIG. 6b, expanded in FIG. 6c at the level of the interface between the two guides 100, 200, illustrates the mode adaptation thanks to the flared part 211 of the device according to the invention.

The paragraphs below highlight how the sizing of the core 210 of the second guide 200 impacts the performances of the coupling device, in particular in terms of reducing the diffusion in the sheath 220 (and therefore in terms of absorptivity/responsiveness when it relates to a photodiode) and in terms of bandwidth.

In the non-limiting example below, the wall of the flared part 2112 develops according to a sinusoidal law. The development in width of the flared part 2112 according to the axis z, substantially follows the following equation:

$$w(z) = w_i + w_g \cdot \sin\frac{(\pi z)}{2Le} \quad (1)$$

Wherein

Wi is the width of the core 110 of the first guide 100. Preferably, Wi is the width of the end wall 2111 forming the contact with the first guide.

W0 is the width of the main portion 212 of the second guide 200, i.e. the substantially constant section portion;

Le is the length of the end portion 211 and more specifically, the flared part 2111;

Wg corresponds to the maximum expansion of the end portion 212 (i.e. the exceeding thereof of maximum width with respect to the width Wi). WImax is the maximum width of the end portion 211. As illustrated in FIG. 5, WImax is equal to the width Wi with added expansion Wg.

The widths are taken along the axis x, the lengths are taken along the axis z, the sections are taken along the planes parallel to the plane xy. In the case where the sections of the cores 110, 210 are circular, the widths thus correspond to the diameters.

Significant parameters for designing the flared end portion 211 are therefore the maximum expansion $W_g$, and the length Le of the flared end portion 211.

In the case of a photodiode, the damaging impact connected to the presence of this flared part 2112 is a decrease in the bandwidth with respect to a coupling device without flared part 2112. Indeed, a certain part of the light is absorbed in the flared part 2112 of thickness greater than the guide extending it. In this flared part 2112, the extraction of the charges is slower.

The overall bandwidth of the photodiode with flared part 2112 can be calculated by integrating the local bandwidth along the propagation of the light, and by considering the reduction of the absorption density according to Beer-Lambert law:

$$BP = \left(\frac{\alpha}{1-e^{-\alpha Lt}}\right)\int_{z=0}^{Lt} e^{-\alpha z} \cdot bp(w(z)) \cdot d \quad (2)$$

Wherein:
bp(w(z)) is the bandwidth corresponding to a streamlined photodiode of width w(z),
α is the absorption coefficient of the photodiode ($\mu m^{-1}$) (second guide 200),
$L_t$ is the length of the second waveguide 200.

Figure 7:
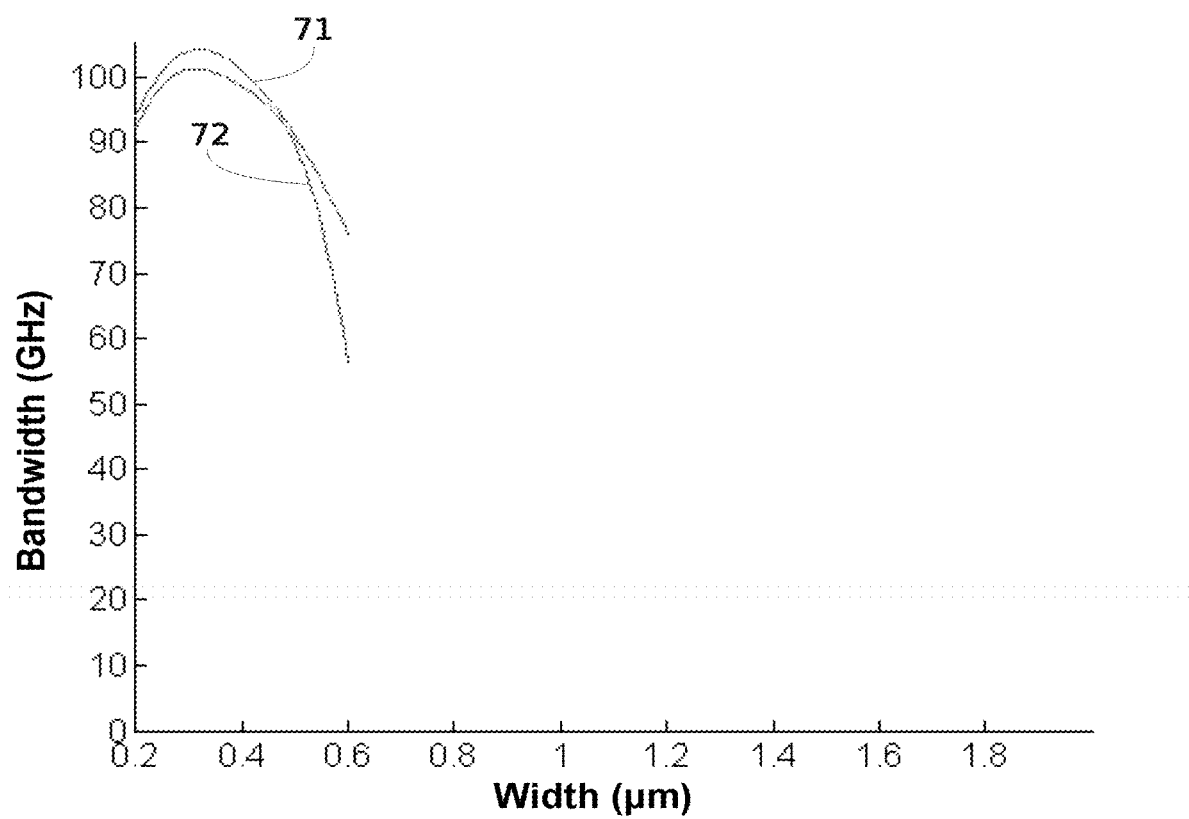
FIG. 7 illustrates the development of the bandwidth of a photodiode according to the state of the art and of a photodiode according to the invention according to the width of the intrinsic zone formed by the core of the second guide.

The developments in the bandwidth of a conventional Si/Ge-i/Si type photodiode (i.e. without flared part as the invention proposes) (curve referenced 71) and of a photodiode according to the invention (curve referenced 72), according to the width W0 thereof are represented in FIG. 7. As this figure shows, it is observed for these two photodiodes, first an advantageous increase of the bandwidth when the width decreases. This is due to a decrease in the transit time of the carriers. Then, when the photodiode width decreases too much (typically when the width is less than 0.3 μm), the bandwidth thus suddenly decreases, as even if the transit time of the carriers decreases favourably, the constant delay RC itself increases by a lot.

In the scope of the development of the present invention, it was expected that if the responsiveness would have been able to increase, thanks to the flared part 2112, the bandwidth would thus be necessarily degraded in a manner that is too damaging.

Unexpectedly, it has been observed that the reduction of the bandwidth is considerably lower than what had been provided. Indeed, during the development of the device according to the invention, it has been observed that the flared part 2112 does not need to be too wide, nor too long to be optically effective.

This clearly emerges from FIG. 7 on which the photodiode according to the invention (curve 72) has a bandwidth very close to that of a conventional photodiode (curve 71) on the domain considered of widths W0. Indeed, for this non-limiting photodiode example according to the invention, the latter has a bandwidth very close to that of a photodiode with no flared part for widths W0 of between 0.55 μm.

Figure 8A:
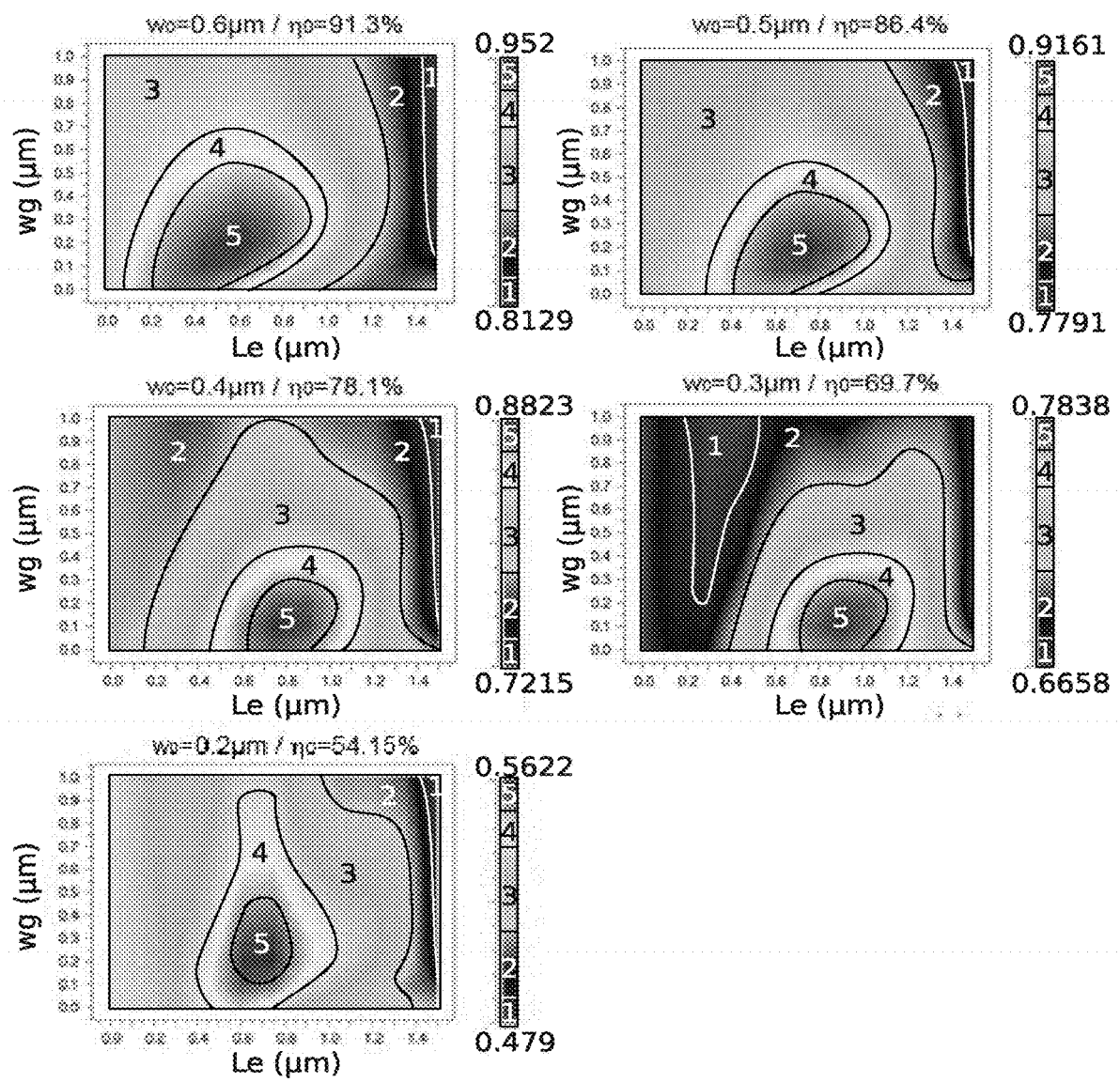
FIG. 8a illustrates simulations, according to the finite-difference time-domain (FDTD) method, of the responsiveness of photodiodes according to the parameters of the end portion of the core of the second waveguide.

The simulations below of FIGS. 8a and 8b show that the invention makes it possible to improve the product responsiveness x bandwidth. Thus,
either with responsiveness equal to a streamlined photodiode, the invention makes it possible to improve the bandwidth,
or with equal bandwidth, the invention makes it possible to improve responsiveness.

In these figures, by FDTD (finite difference time domain) method is simulated, a double heterojunction photodiode, such as presented in FIG. 5 with the wavelength λ=1.55 μm (α=10 μm$^{-1}$). The parameters that one simulation is made to vary from the other, are those associated with a flared part 2112, that is Wg and Le. Wi is fixed to 0.6 μm and W0 is also fixed.

With these conditions, and by making Wg and Le vary, a cartography is obtained.

Thus, by making W0 vary from 0.6 μm to 0.1 μm, the cartographies illustrated in FIG. 8a are obtained, and which mentions the nominal performance $\eta_0$ of a corresponding right photodiode (with no flared part). Each time the absorption is traced in the photodiode (responsiveness).

The table of FIG. 8b mentions the absorptivity and the bandwidth calculated according to the equation (2) below and the curve of FIG. 7.

The first thing that is observed from these simulations, is that the invention truly provides an improvement in the responsiveness with respect to the conventional photodiode (with no flared part) of width W0, and of nominal performance $\eta_0$.

In this simulation, the maximum improvement is obtained by a small expansion (Wg=0.1 μm typically), and a small length of flared part 2111 (Le=0.8 μm). This means that the coupling device according to the invention works well as a taper, of which the dimension would be very short. Moreover, this also indicates that with these small dimensions of end portion 211, the bandwidth will only be slightly affected by the presence of the flared part 2112, contrary to what would have been the case with a long-dimensioned taper.

Calculating the bandwidth according to the formula (2) actually shows an only low drop of the bandwidth, at W0 fixed.

Thus, the invention makes it possible for an improvement of the product absorptivity x bandwidth.

The invention can thus be applied to have the most relevant advantage for the application that is sought:

either keeping the same W0 as a standard photodiode, to highly increase the responsiveness, while only very slightly degrading the bandwidth;

or reducing the W0 (of a value close to Wg). Thus, the same responsiveness is conserved as the initial standard photodiode of W0, but thus the bandwidth is highly increased.

Figure 9A:
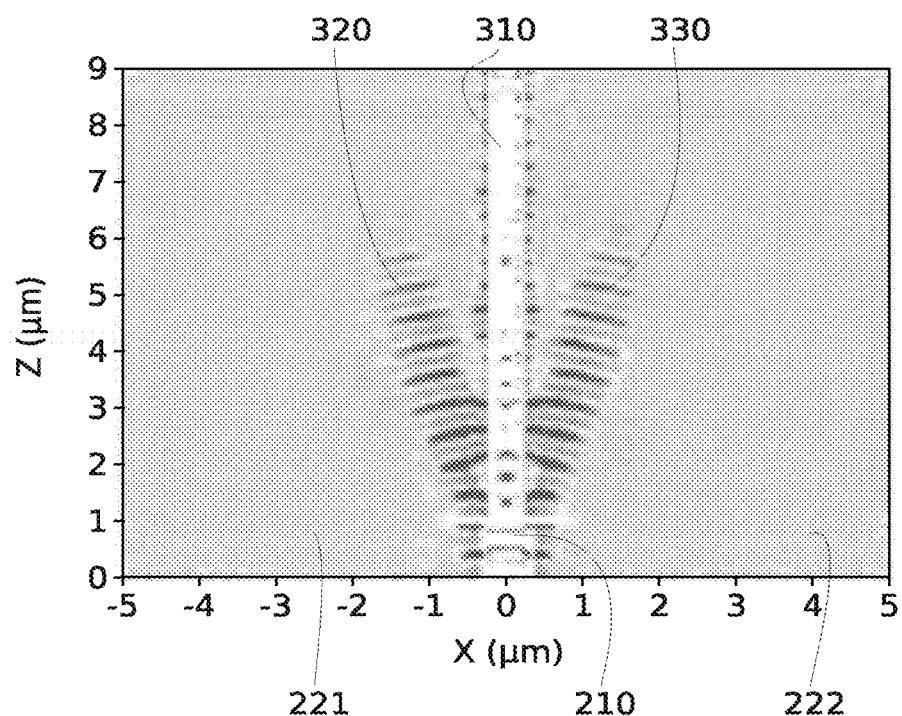
FIGS. 9a and 9b are simulations according to the FDTD method of diffusing light in the core of the second guide, for respectively, a coupling device according to the prior art and coupling device according to the invention.
Figure 9B:
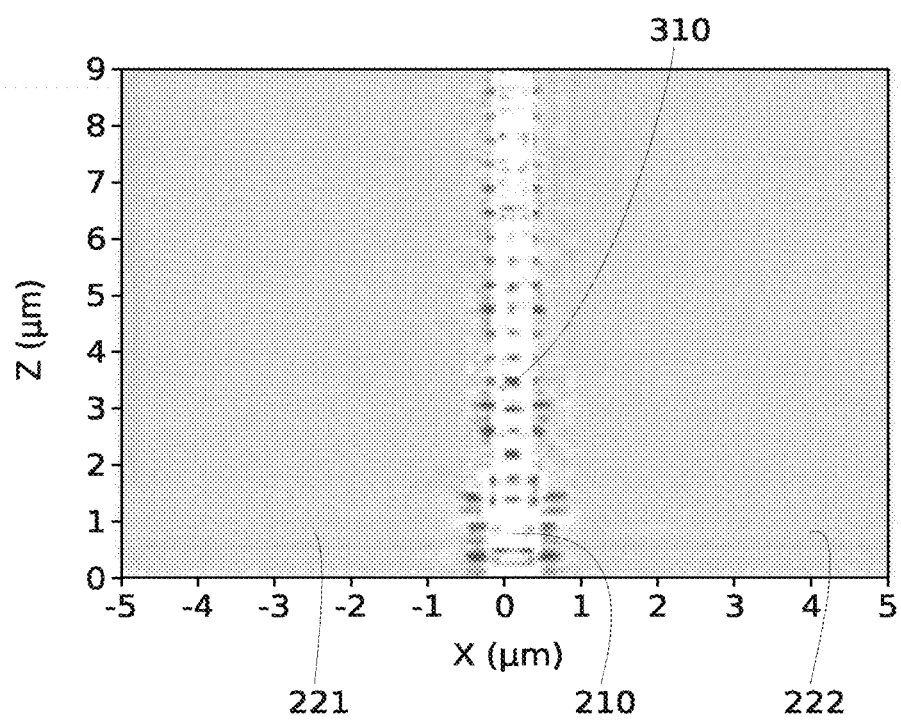

FIGS. 9a and 9b illustrate an FDTD simulation, respectively of a standard photodiode with W0=0.4 µm, and of a photodiode according to the invention with W0=0.4 µm, Wg=0.1 µm and Le=0.8 µm. The W0 is therefore identical for the two photodiodes.

This simulation clearly shows:

in FIG. 9a, that the standard photodiode diffuses (see zones 320, 330) a part of the luminous flux outside of the Ge-i core;

in FIG. 9b, that the photodiode according to the invention has no or only has a significantly small diffusion outside of the Ge-i core.

The coupling device described above has particularly improved performances. However, the invention covers other structures of coupling devices. Some of these variants are described in reference to FIGS. 10a to 10d.

Figure 10A:
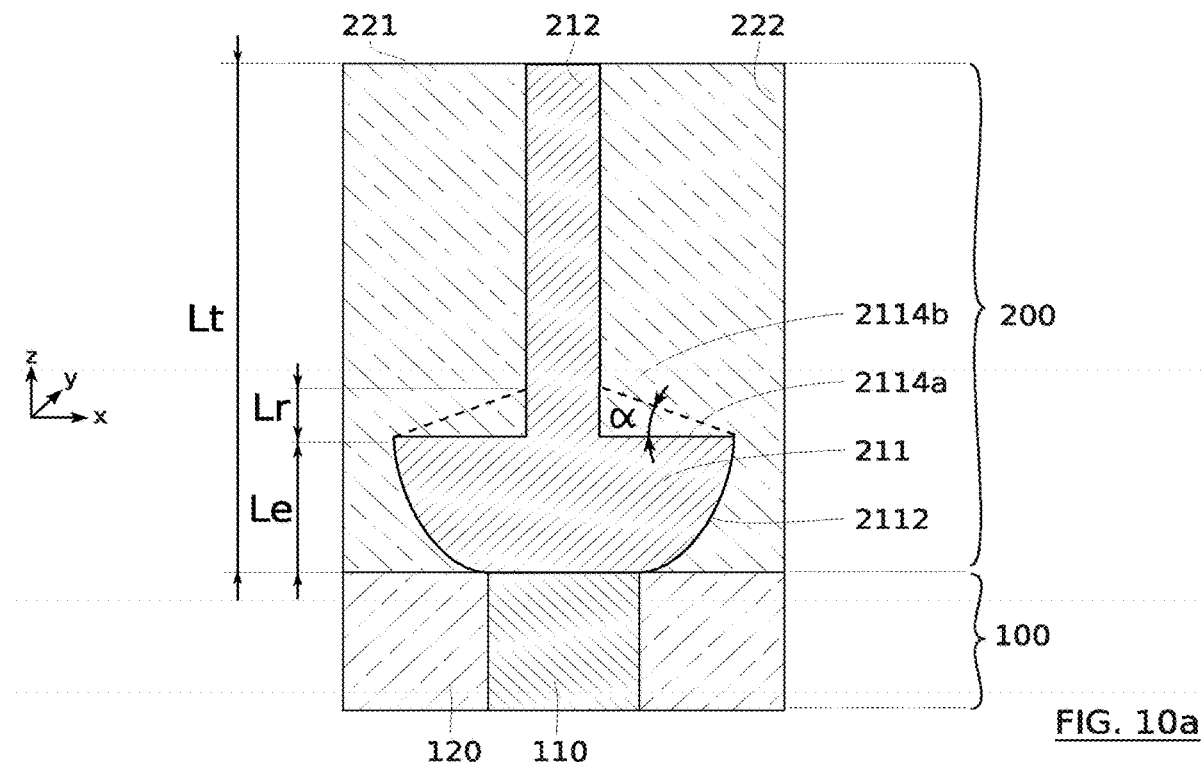
FIGS. 10a to 10d illustrates alternative embodiments to that of FIG. 4.

FIG. 10a schematically illustrates different gradients or curves that can follow the narrowing wall 2114.

In the example of FIG. 5, this wall 2114 forms, with a transversal plane, perpendicular to the axis z, a zero angle α. Thus, this narrowing wall 2114 is perpendicular to the axis z as illustrated in the example of FIG. 5 or as illustrated by the reference 2114a of FIG. 10a. The narrowing is thus very sudden, even immediate.

The angle α can however be non-zero, as illustrated by the reference 2114b of FIG. 10a.

Preferably, this angle α will be positive, i.e. that the value along the axis z of the narrowing wall 2114 will be greater than the level of the main portion 212 than at the level of the flared part 2112. Thus, the narrowing of the flared part is gradual, although quick.

The embodiments with an angle α≥0 have the advantage of facilitating the production of the coupling device. Preferably, 0 ≤α≤45° and preferably 0≤α≤30° and preferably 0≤α≤15°.

Preferably, the length $L_r$ of the narrowing, taken along the axis z is less than Le. Preferably, the length $L_r$ of the narrowing is less than $$\frac{Le}{2}$$

and peferably less than $$\frac{Le}{3}$$

and preferably less than $$\frac{Le}{4}.$$

In the example of FIG. 5, $L_r$=0.

In FIGS. 5 and 10, the narrowing is linear. However, it is preferable to have a non-linear narrowing, with curved shapes, in particular at the level of the junctions with the main part 212 and with the flared shape 2112.

Figure 10B:
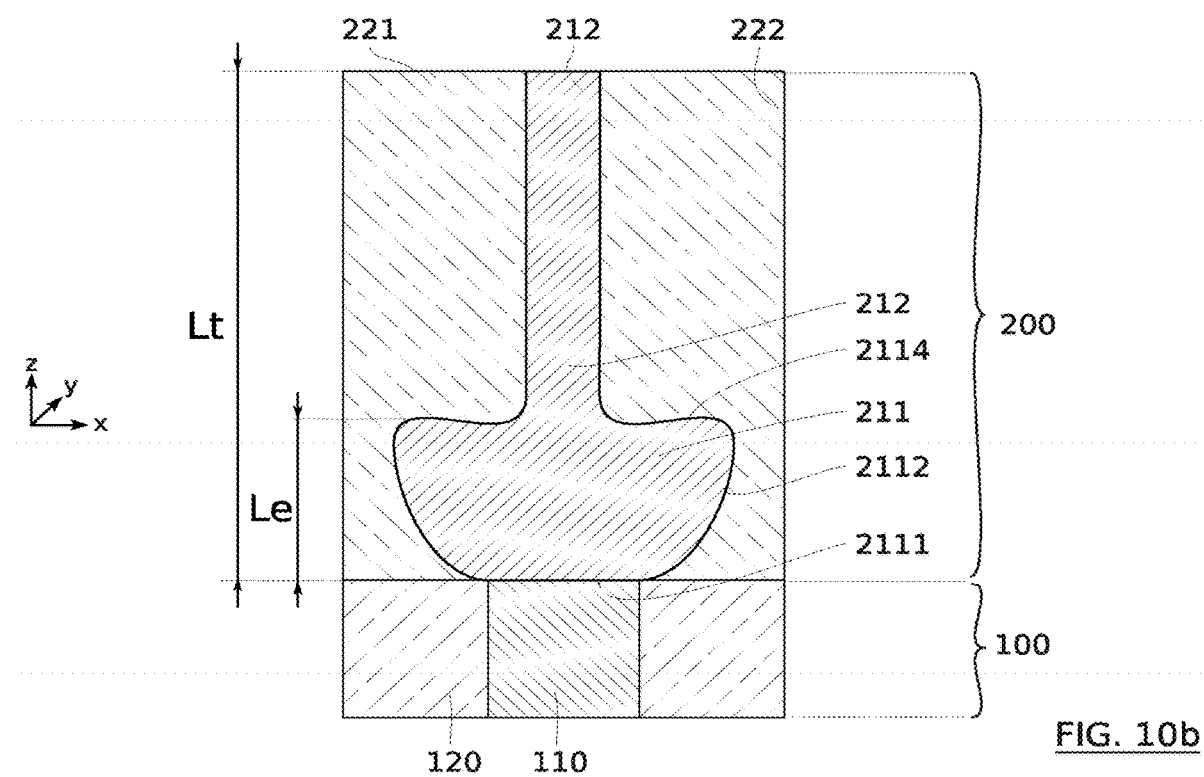
Figure 10C:
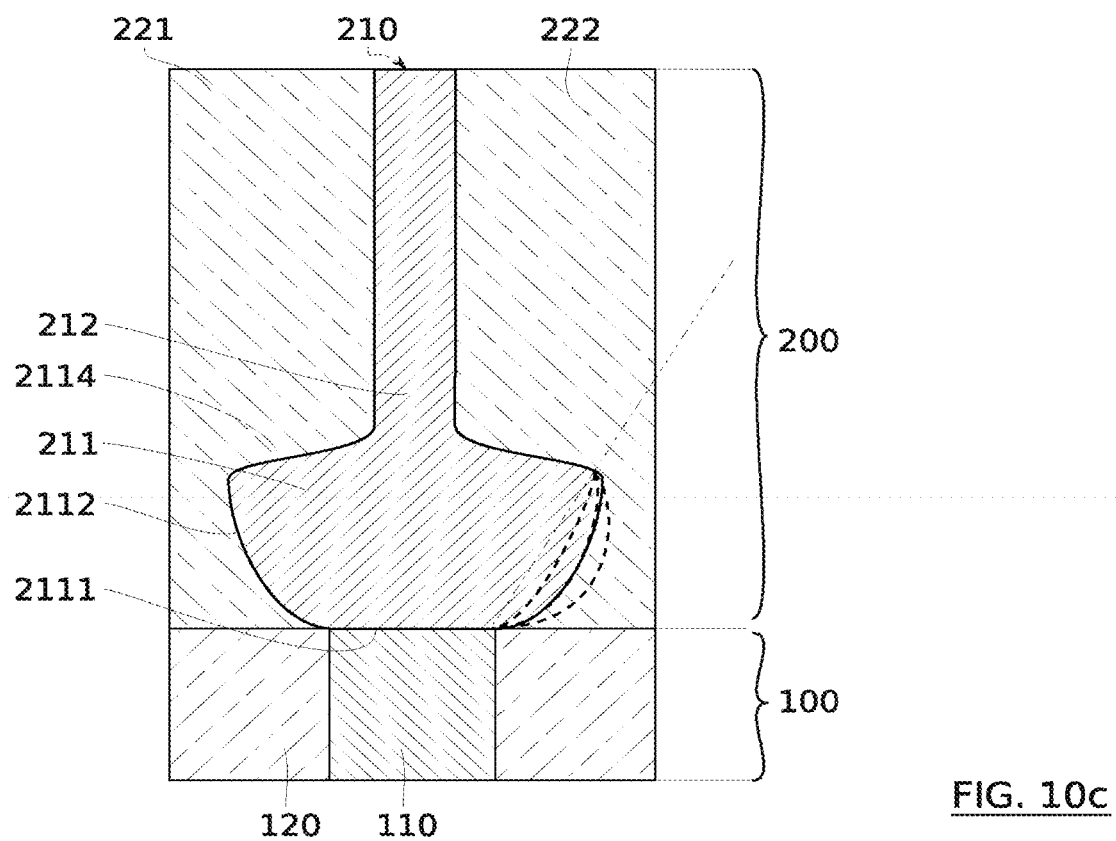

FIGS. 10b and 10c illustrate these types of variants with rounded edges. In practice, due to the imprecisions of lithography methods, the edges are generally rounded.

Advantageously, the total length $L_t$ of the second guide 200 is such that: $L_t \geq 2(Le+l_r)$.

FIG. 10c illustrates different possible shapes for the wall delimiting the flared part 2112. All the shapes which can be considered are the curved illustrated as a regular dotted line which are located below the straight line illustrated as an irregular dash/dot dotted line.

Figure 10D:
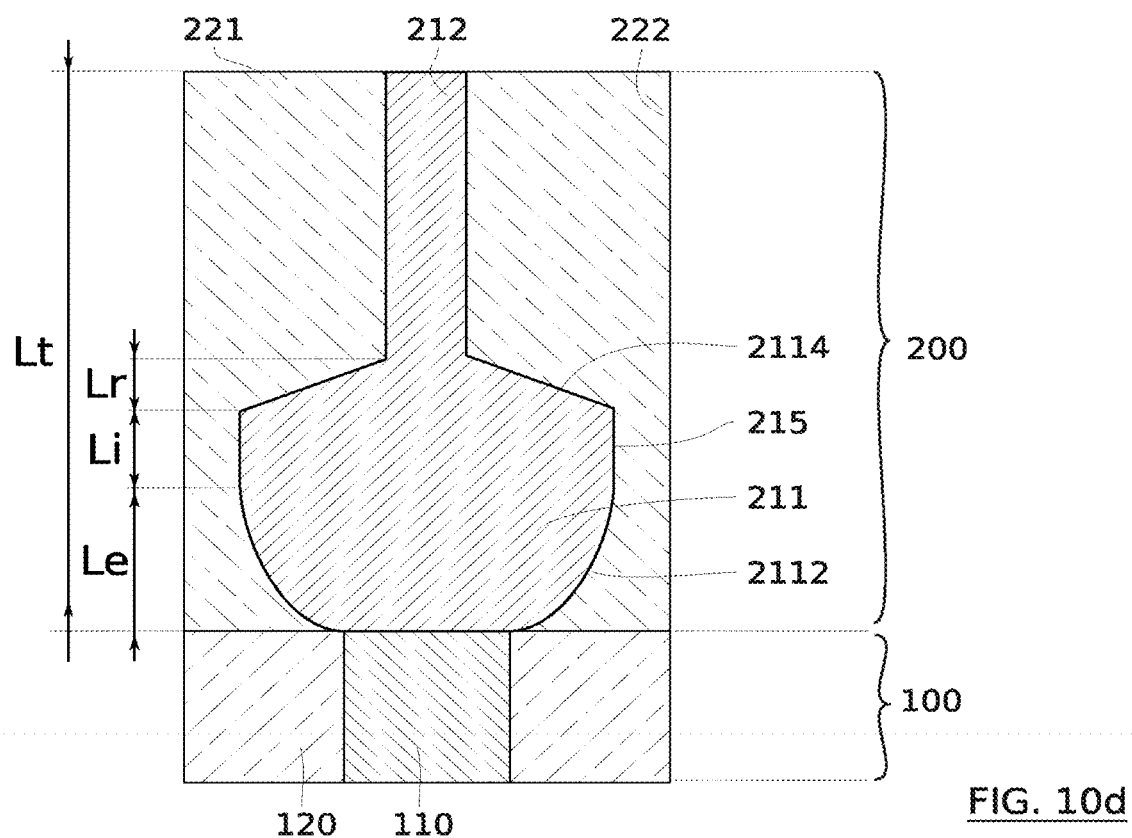

FIG. 10d illustrates a variant wherein the narrowing 2114 does not directly extend the flared part 2112. In this variant, an intermediate part 215, preferably cylindrical, extends the flared part 2112 until the narrowing wall 2114.

Advantageously, but in a non-limiting manner, it appears that $L_t \geq 2(Le+l_i+l_r)$ with $l_i$=length along z of the intermediate part 2115.

The invention has been described below through a non-limiting example of application to double heterojunction photodiodes.

It is applied to other types of photodiodes as those illustrated and for example to avalanche photodiodes.

As a non-limiting example, the following dimensions can be adapted by coupling devices according to the invention, in particular those illustrated in FIGS. 5, 10a to 10d but also for other variants covered by the claims: for a wavelength λ=1.55 µm (α=10 µm$^{-1}$):

Wg is less than 2 µm. Preferably, Wg is between 0.05 µm and 2 µm, preferably between 0.05 µm and 0.7 µm, preferably between 0.1 µm and 0.5 µm, preferably of around 0.1 µm;

Le is between 0.1 µm and 1.5 µm, preferably between 0.2 µm and 1.2 µm, preferably between 0.4 µm and 1 µm, preferably of around 0.8 µm;

Wi is between 0.2 µm and 1.0 µm, preferably between 0.4 µm and 0.8 µm, preferably between 0.5 µm and 0.7 µm;

W0 is between 0.15 µm and 1.0 µm, preferably between 0.15 µm and 0.8 µm, preferably between 0.2 µm and 0.6 µm.

When the coupling device forms a photodiode, in particular that illustrated in FIG. 5 and described in the corresponding passages, the dimensions above make it possible to considerably improve the product absorptivity x bandwidth. These dimensions are advantages also apply to the variants described in reference to FIGS. 10a to 10d.

The invention also applies to any other coupling device between different materials not necessarily forming a photodiode. Indeed, if nc1 and bg1 are referenced respectively, the core and sheath indices of the input guide of the light; and nc2 and ng2 respectively the core and sheath indices of the output guide of the light, the invention can thus be applied, in particular the shape of the flared part 2112, each time that the difference in core/sheath indices of the output guide is lower than that of the input, i.e. each time that: nc1-ng1>nc2-ng2. This difference in index between the refraction index of the core of a guide and the refraction index of the sheath of this same guide is called index contrast.

As indicated above, in the non-limiting example illustrated in FIGS. 5, 6b, 6c and 10a to 10d, the sheath portion to consider in terms of refraction index is the lateral portion of the sheath 220, i.e. that extending along the axis x. Thus, in the formula above, ng2 corresponds to the refraction index of the zones 221 and 222. If these zones are made of Si-n and Si-p, ng2 will therefore be equal to the refraction index of silicon, Si-n and Si-p having the same index values (that of Si).

The principle of the present invention functions in the opposite direction. If the preceding relationship is not verified, all that is needed, is to apply a symmetry, i.e. all that is needed, is to return the flared part 2112 and to place it at the end of injection guide.

An example of a method for producing a coupling device illustrated in FIG. 5 or 10a to 10d will now be described in FIGS. 11a to 11g. Each of FIGS. 11a to 11g comprises a cross-sectional view of the second waveguide 200 (view along a section xy) and a view from above (view parallel to the plane zx).

The first step (FIG. 11a) consists of providing a layer stack in particular comprising:
- a substrate 2220, for example, a dielectric material such as $SiO_2$;
- a layer 22 surmounting the substrate 2220 and intended to partially form at least the sheath for the core 210. This layer 22 is preferably, but in a non-limiting manner, made of a semi-conductive material such as silicon.

According to an embodiment, this layer 22 has at least two doped zones situated on either side of the axis y. Thus, a zone situated for example to the left of the axis y is n doped and another zone situated to the right of the axis y is p doped.
- a layer 223, for example made of a dielectric material such as $SiO_2$, is intended to form a hard mask.

Figure 11A:
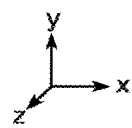
FIGS. 11a to 11g, illustrates the main steps of an example of a method for making a coupling device according to the invention.
Figure 11A:
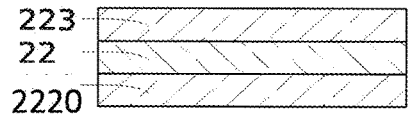
Figure 11A:
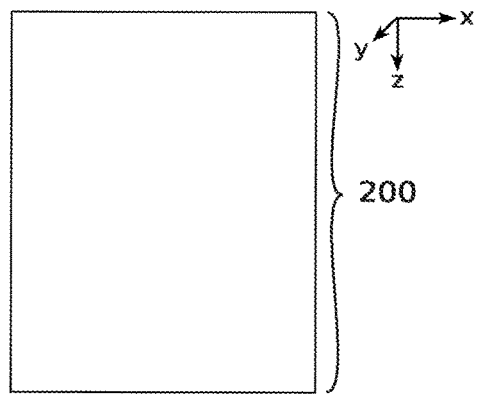
Figure 11B:
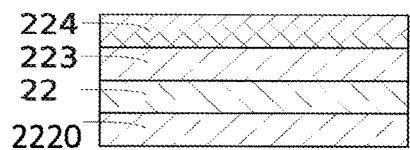
Figure 11B:
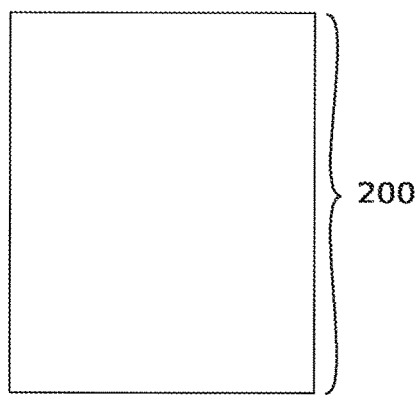
Figure 11C:
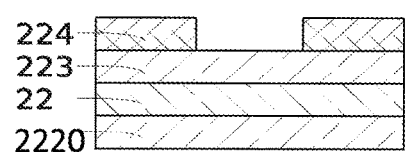
Figure 11C:
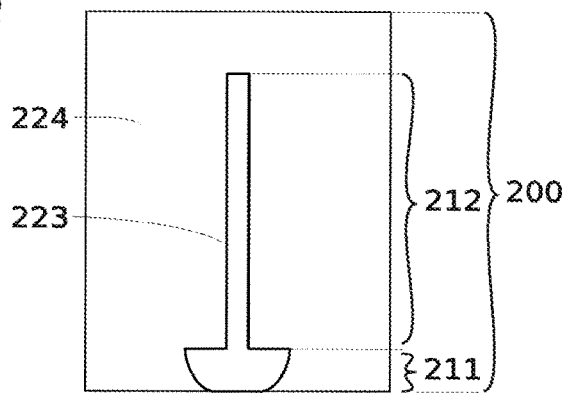
Figure 11D:
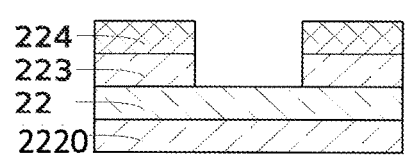
Figure 11D:
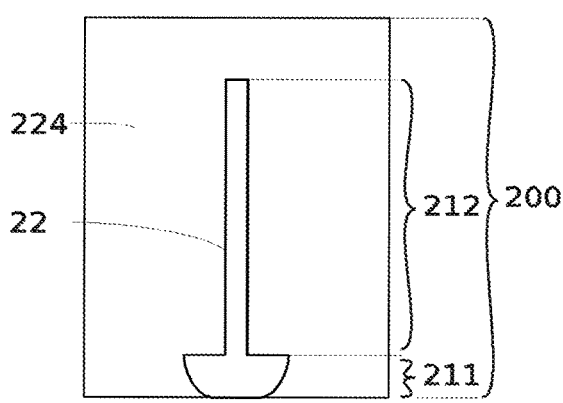

The steps illustrated in FIG. 11b to 11d aim to etch the hard mask 223 to give it the shape of the core 210 of the second waveguide 200. This shape appears in FIGS. 11c and 11d.

For example, a resin layer 224 is deposited (FIG. 11b) that is opened (FIG. 11c) by any suitable lithography means (photolithography, electron beam lithography, nanoprinting, etc.) in order to give the opening the desired shape for the core 210 of the waveguide 200.

Figure 11E:
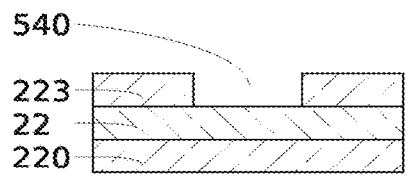
Figure 11E:
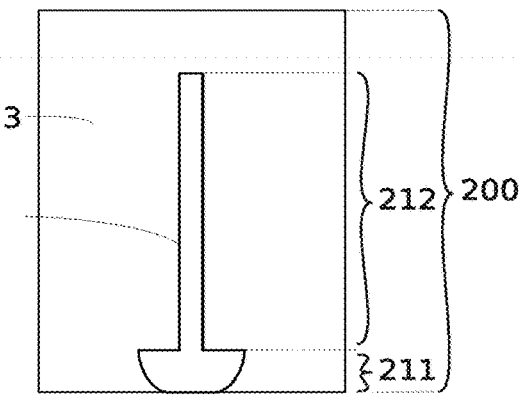
Figure 11F:
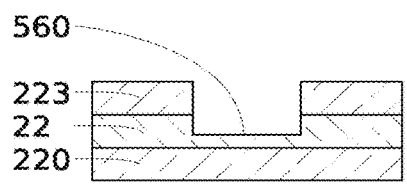
Figure 11F:
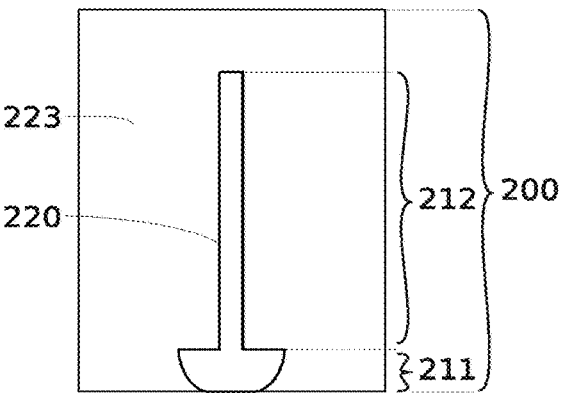

As illustrated by FIG. 11d, the hard mask 223 is then etched through the mask formed by the open resin layer 224. Then, the resin layer 224 is removed (FIG. 11e). Thus, the layer 22 intended to partially form the sheath is etched through the hard mask 223.

Figure 11G:
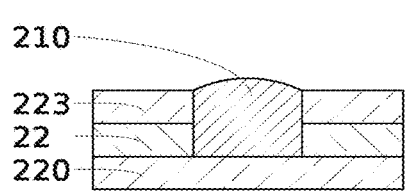
Figure 11G:
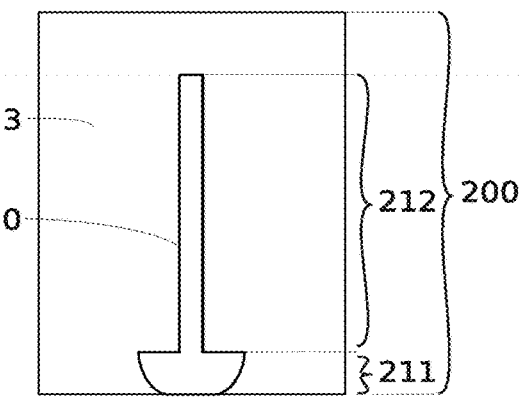

Then, a filling of the cavity 540 thus formed by the material forming the core 210 of the second waveguide 200 is proceeded with (FIG. 11g). The core 210 thus has the desired shape, with, in particular, the flared end portion 211 and the main portion 212.

According to an embodiment, to fill the core 210, a growth by epitaxy from a residual layer 560 of the layer 22 left in place at the end of etching is proceeded with.

Thus, according to this embodiment, the etching of the layer 22 is only partial and leaves a thickness 560 in the bottom of the opening 540.

For example, if the material of the layer 22 if crystalline or polycrystalline silicon, the cavity can be filled by making the germanium grow by epitaxy.

Preferably, then a flattening step is carried out, for example, by chemical-mechanical polishing (CMP) such that the upper faces of the layer 22 and of the core 210 are substantially comprised in the same plane.

Then, it is possible to cover the upper faces of the layer 22 and of the core 210 by a protective layer, preferably a dielectric layer, for example a layer made of $SiO_2$.

It is then possible to produce electrical contacts at the level of the doped zones by all techniques, widely known to a person skilled in the art, for example by producing interconnecting holes, then by filling these holes with an electrically conductive material.

This method has the advantage of being simple and perfectly reproducible. It thus makes it possible to produce the coupling device simply, and at a limited cost.

The invention is not limited to the embodiments described above, and extends to all embodiments covered by the claims.

The invention claimed is:

1. A device for coupling at least two waveguides, the device comprising a first waveguide and a second waveguide, each waveguide comprising a core and a sheath, the difference between the refraction indices of the core and of the sheath of the first waveguide being greater than the difference between the refraction indices of the core and of the sheath of the second waveguide, wherein the core of the second waveguide comprises:
   an end portion having at least:
      a flat end wall in contact with the core of the first waveguide,
      a flared part of convex shape extending the end wall by extending from the first waveguide, the flared part having a section which increases by extending from the first waveguide, the section being taken along a transversal plane (xy) perpendicular to a main extension direction (z) of the core of the second waveguide,
      a narrowing, of which the section, parallel to said transversal plane, decreases by extending from the first waveguide,
   a main portion, extending the end portion by extending from the first waveguide and having a substantially constant section, taken parallel to said transversal plane.

2. The device according to claim 1, wherein the flared part is flared according to a non-linear profile.

3. The device according to claim 1, wherein the flared part is flared according to a profile forming a quarter of a period of a sinusoidal function.

4. The device according to claim 1, wherein said narrowing extends the flared part by extending from the first waveguide and until reaching the main portion.

5. The device according to claim 1, therein the narrowing has a narrowing wall extending between the flared part and the main portion, said narrowing wall being substantially linear and defines, with a plane perpendicular to said main direction (z), an angle α of between 0 and 30 degrees.

6. The device according to claim 1, wherein the length Lr of the narrowing is less than the length Le of the flared pan, such that $$Lr \le \frac{Le}{2} \text{ and } Lr \le \frac{Le}{3} \text{ and } Lr \le \frac{Le}{4},$$

Lr and Le being taken along the main extension direction (z) of the core of the second waveguide.

7. The device according to claim 1, wherein the ratio of the length of the end portion over the total length Lt of the core of the second waveguide is less than or equal to 0.5, said length being taken along said main direction (z).

8. The device according to claim 1, wherein the ratio of the maximum width W1max of the end portion over the width of the end portion situated closer to the first waveguide is between 1.1 and 3, said widths being taken in a plane parallel to said transversal plane, the maximum width W1max of the end portion being less than or equal to 50 µm ($10^{-6}$ metres).

9. The device according to claim 1, wherein the ratio of the maximum width W1max of the end portion over the maximum width W0 of the main portion of the second waveguide is between 1.1 and 6, these widths being taken in a plane perpendicular to said main direction (z).

10. The device according to claim 1, wherein the core of the first waveguide and the core of the second waveguide are formed in different materials.

11. The device according to claim 1, wherein the core of the first waveguide is silicon-based and the core of the second waveguide is germanium-based.

12. The device according to claim 1, wherein the core of the second waveguide is formed of an intrinsic semi-conductive material and the sheath of the second waveguide comprises at least two zones of a respectively p and n doped semi-conductive material.

13. The device according to claim 12, wherein the core of the second waveguide is made of intrinsic Ge (Ge-i) and said zones are p and n doped silicon (Si) zones.

14. The device according to claim 1, forming a double heterojunction photodiode.

15. The device according to claim 1, forming an avalanche photodiode.

16. The device according to claim 1, wherein at least one from among the sheath of the first waveguide and of the second waveguide comprises air, a gas or a void.

17. A microelectronic device comprising a plurality of coupling devices according to claim 1.

18. The device according to claim 5, wherein the angle α is between 0 and 15 degrees.

19. The device according to claim 7, wherein the ratio of the length (Le+Li+Lr) of the end portion over the total length Lt of the core of the second waveguide is less than or equal to 0.3.

20. The device according to claim 8, wherein the maximum width W1max of the end portion is less than or equal to 10 µm.

21. The device according to claim 8, wherein the maximum width W1max of the end portion is less than or equal to 1 µm.

* * * * *